(12) United States Patent
Peng et al.

(10) Patent No.: US 7,816,174 B2
(45) Date of Patent: Oct. 19, 2010

(54) CONTROL ELEMENT OF AN ORGANIC ELECTRO-LUMINESCENT DISPLAY AND MANUFACTURING PROCESS THEREOF

(75) Inventors: Jen-Chien Peng, Jhubei (TW); Meng-Hsiang Chang, Tainan (TW)

(73) Assignee: Au Optronics Corporation, Hsin-Chu (TW)

( * ) Notice: Subject to any disclaimer, the term of this patent is extended or adjusted under 35 U.S.C. 154(b) by 0 days.

(21) Appl. No.: 12/543,059

(22) Filed: Aug. 18, 2009

(65) Prior Publication Data

US 2009/0305476 A1    Dec. 10, 2009

Related U.S. Application Data

(62) Division of application No. 11/406,727, filed on Apr. 19, 2006, now Pat. No. 7,595,503.

(30) Foreign Application Priority Data

Oct. 12, 2005 (TW) .............................. 94135570 A

(51) Int. Cl.
*H01L 51/40* (2006.01)

(52) U.S. Cl. ........................... 438/99; 438/158

(58) Field of Classification Search ................... 438/99
See application file for complete search history.

(56) References Cited

U.S. PATENT DOCUMENTS

| | | | |
|---|---|---|---|
| 5,202,572 A | 4/1993 | Kobayashi | |
| 6,356,318 B1 | 3/2002 | Kawahata | |
| 6,746,959 B2 | 6/2004 | Lyu | |
| 7,115,906 B2 | 10/2006 | Lai | |
| 7,333,079 B2 | 2/2008 | Shibusawa et al. | |
| 2003/0116764 A1 | 6/2003 | Fujikawa et al. | |

FOREIGN PATENT DOCUMENTS

| | | |
|---|---|---|
| CN | 1577914 | 2/2005 |
| CN | 1588519 | 3/2005 |
| TW | 519766 | 2/2003 |
| TW | I231973 | 5/2005 |

*Primary Examiner*—Lex Malsawma
*Assistant Examiner*—Kimberly Trice
(74) *Attorney, Agent, or Firm*—Thomas, Kayden, Horstemeyer & Risley, LLP

(57) ABSTRACT

A control element of an organic electro-luminescent display includes a first transistor, a second transistor and a capacitor. The first gate electrode of the first transistor is electrically connected to a scan line, and the first source/drain electrode of the first transistor is electrically connected to a data line. The second gate electrode of the second transistor is electrically connected to the second source/drain electrode of the first transistor. The third source/drain electrode of the second transistor is electrically connected to a working voltage, and the fourth source/drain electrode of the second transistor is electrically connected to a light emitting diode. One end of the capacitor is electrically connected to the second gate electrode. The material of the dielectric layer of the capacitor is different from the material of the gate dielectric of one of the first transistor and the second transistor.

4 Claims, 4 Drawing Sheets

US 7,816,174 B2

CONTROL ELEMENT OF AN ORGANIC ELECTRO-LUMINESCENT DISPLAY AND MANUFACTURING PROCESS THEREOF

RELATED APPLICATIONS

The present application is a divisional of U.S. application Ser. No. 11/406,727, filed on Apr. 19, 2006, which was based on, and claims priority from, Taiwan Application Serial Number 94135570, filed Oct. 12, 2005, the disclosure of which is hereby incorporated by reference herein in its entirety.

BACKGROUND

1. Field of Invention

The present invention relates to a method for manufacturing an organic electro-luminescent display. More particularly, the present invention relates to a method for manufacturing a control element of an organic electro-luminescent display.

2. Description of Related Art

Organic electro-luminescent displays have the advantages of low cost, long life, low driving voltage, high reaction speed, effective lighting, excellent temperature difference endurance, excellent vibration endurance, wide viewing angle and dimensional thinness. Many manufactures have spent great effort and resources researching and developing organic electro-luminescent displays. Thus, organic electro-luminescent displays may replace thin film transistor liquid crystal displays in the coming years.

Reference is made to FIGS. 1A~1E, which are cross-sectional views showing a traditional method for manufacturing a control element of an organic electro-luminescent display. In FIG. 1A, a first gate electrode 122 of a first transistor, a bottom electrode 124 of a capacitor and a second gate electrode 126 of a second transistor are formed on an insulating substrate 110.

In FIG. 1B, a dielectric layer 130 is formed over the first gate electrode 122, the bottom electrode 124 of the capacitor and the second gate electrode 126 as a gate dielectric of the first transistor and the second transistor and a dielectric layer of the capacitor. Then, a first channel 142 of the first transistor and a second channel 146 of the second transistor are formed over parts of the first gate electrode 122 and the second gate electrode 126.

In FIG. 1C, an etching stop layer 150 is formed. The etching stop layer 150 is positioned over part of the first gate electrode 122 and the second gate electrode 126 for preventing influence from subsequent processes.

In FIG. 1D, a doped semiconductor layer 160 is formed over the insulating substrate 110. Then, the doped semiconductor layer 160 and the dielectric layer 130 are patterned and a hole 180 is formed to expose portion of the second gate electrode 126. The source/drain junctions of the first transistor and the second transistor are formed in this step.

In FIG. 1E, a conductor layer 170 is formed over the insulating substrate 110 and in the hole 180. Then, the conductor layer 170 is patterned for forming the source/drain electrode of the first transistor, the second transistor and a conducting wire. The conducting wire electrically connects the drain of the first transistor, the upper electrode of the capacitor, and the second gate electrode 126.

The etching stop layer and the hole are formed separately in the traditional method for manufacturing a control element of an organic electro-luminescent display. This may increase the amount of steps comprised by the traditional method such that the cost of the organic electro-luminescent display is increased and the yield of the organic electro-luminescent display is decreased.

Moreover, the dielectric layer of the capacitor and the gate dielectric of the first transistor and the second transistor are formed in the same step in the traditional method for manufacturing a control element of an organic electro-luminescent display. Thus, the electrical and geometric characteristics of the first transistor and the second transistor change if the capacitance of the capacitor is changed, such that the design of the control element of the organic electro-luminescent display is limited.

For the foregoing reasons, there is a need for a manufacturing method of a control element of an organic electro-luminescent display, which enables reducing the steps of the method and relaxes the design limitation.

SUMMARY

It is therefore an aspect of the present invention to provide a method for manufacturing a control element of an organic electro-luminescent display, which enables reducing the steps of the method such that the cost of the organic electro-luminescent display is decreased and the yield of the organic electro-luminescent display is enhanced.

It is another aspect of the present invention to provide a method for manufacturing a control element of an organic electro-luminescent display, which can prevent the electrical characteristics of the transistors of the organic electro-luminescent display from being changed when the capacitance of the capacitor of the organic electro-luminescent display is changed.

It is another aspect of the present invention to provide a method for manufacturing a control element of an organic electro-luminescent display, which can prevent the geometric characteristics of the transistors of the organic electro-luminescent display from being changed when the capacitance of the capacitor of the organic electro-luminescent display is changed.

In accordance with the foregoing and other aspects of the present invention, a control element of an organic electro-luminescent display including a first transistor, a second transistor and a capacitor is provided. The first gate electrode of the first transistor is electrically connected to a scan line and the first source/drain electrode of the first transistor is electrically connected to a data line. The second gate electrode of the second transistor is electrically connected to the second source/drain electrode of the first transistor. The third source/drain electrode of the second transistor is electrically connected to a working voltage, and the fourth source/drain electrode of the second transistor is electrically connected to a light emitting diode. One end of the capacitor is electrically connected to the second gate electrode, and the other end of the capacitor is electrically connected to a reference voltage. The material or thickness of the dielectric layer of the capacitor is different from the material or thickness of the gate dielectric of one of the first transistor and the second transistor.

According to one preferred embodiment of the invention, the capacitor may further include a capacitor stack. The capacitor stack is positioned between the bottom electrode and the dielectric layer of the capacitor. Moreover, the capacitor stack may include a stack dielectric positioned over the bottom electrode of the capacitor. The material or thickness of the stack dielectric is the same as the material or thickness of the gate dielectric of the first transistor and the second transistor.

In accordance with the aspects of the present invention, a method for manufacturing a control element of an organic electro-luminescent display is provided. The method includes the following steps. First, a first gate electrode, a bottom electrode of a capacitor and a second gate electrode are formed on an insulating substrate. Then, a first gate dielectric and a first channel are formed over at least part of the first gate electrode, and a second gate dielectric and a second channel are formed over at least part of the second gate electrode. Afterward, an etching stop layer is formed over the insulating substrate. After forming the etching stop layer, the etching stop layer is patterned to expose parts of the upper surface of the first channel and the second channel for forming source/drain contacts on each of the first channel and the second channel and form a hole on part of the second gate electrode. Then, a doped semiconductor layer and a conductor layer are formed over the insulating substrate in order. Finally, the conductor layer and the doped semiconductor layer are patterned for forming a first source/drain electrode and a second source/drain electrode on the first channel, a third source/drain electrode and a fourth source/drain electrode on the second channel, a conducting wire to electrically connect the second source/drain electrode and the second gate electrode via the hole, and an upper electrode of the capacitor.

According to one preferred embodiment of the invention, a capacitor stack may be formed over the bottom electrode of the capacitor before forming the etching stop layer. The capacitor stack may include a stack dielectric positioned over the bottom electrode of the capacitor. The material or thickness of the stack dielectric is the same as the material or thickness of the gate dielectric of the first transistor and the second transistor.

Therefore, the etching stop layer and the hole are formed in the same step in the foregoing preferred embodiment of the invention, which reduces the use of photolithography. Photolithography is an expensive and time-consuming process and can be misaligned. Therefore, reducing the use of photolithography can reduce the probability of misalignment, cost and time. Moreover, the yield of the organic electro-luminescent display is enhanced by reducing the use of photolithography. In addition, the dielectric of the capacitor may be different from the gate dielectric of the first transistor and the second transistor. Thus, the electrical and geometric characteristics might not need to be changed when the capacitance of the capacitor is changed.

It is to be understood that both the foregoing general description and the following detailed description are by examples and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1A:
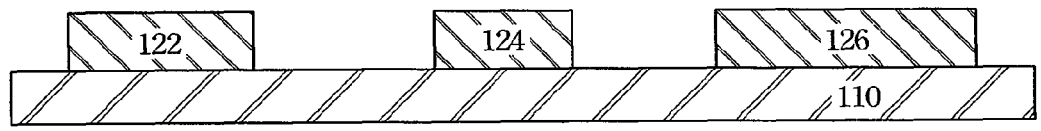
FIGS. 1A~1E are cross-sectional views showing a traditional method for manufacturing a control element of an organic electro-luminescent display.
Figure 1B:
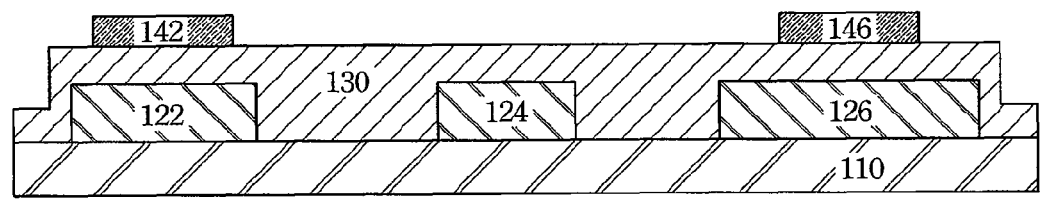
Figure 1C:
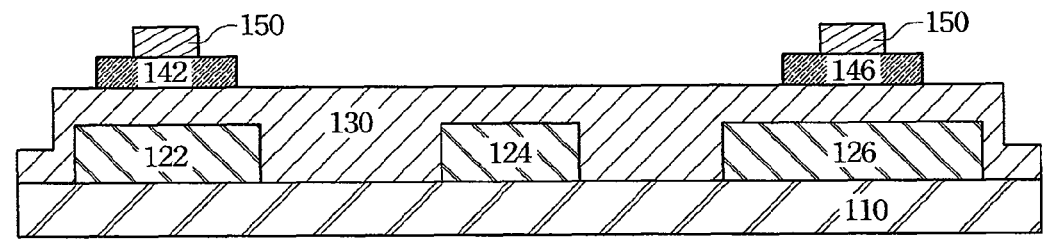
Figure 1D:
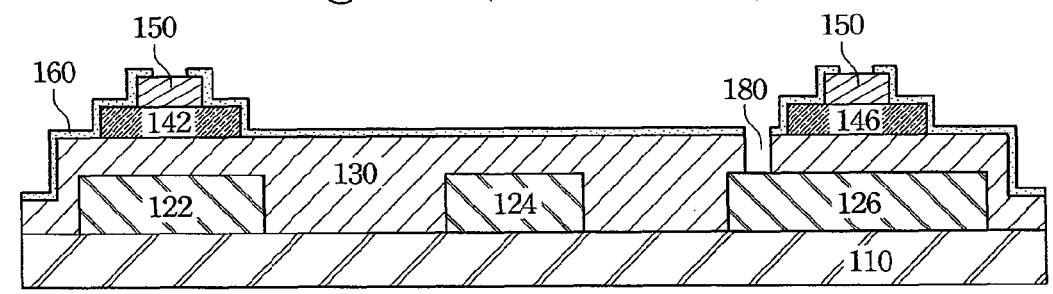
Figure 1E:
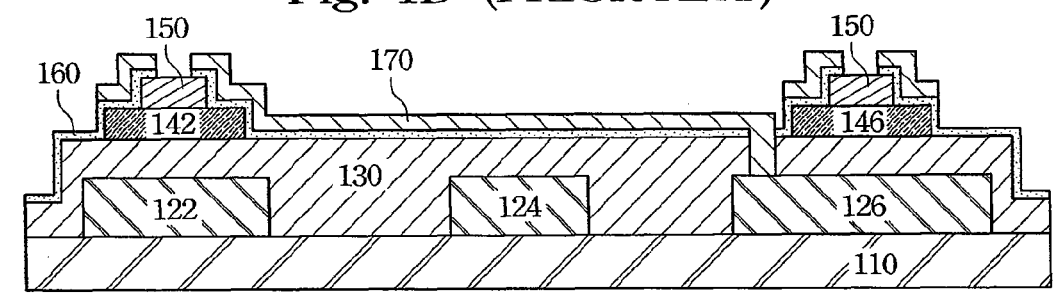

Reference will now be made in detail to the present preferred embodiments of the invention, examples of which are illustrated in the accompanying drawings. Wherever possible, the same reference numbers are used in the drawings and the description to refer to the same or like parts.

Embodiment I

Reference is made to FIGS. 2A~2D, which are cross-sectional views showing a method for manufacturing a control element of an organic electro-luminescent display according to one preferred embodiment of the invention.

Figure 2A:
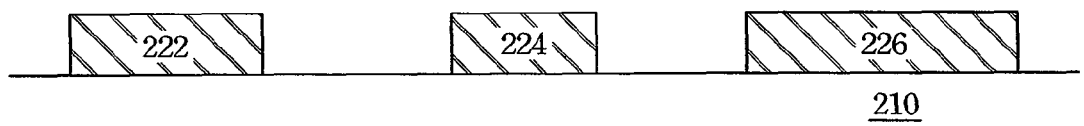
FIGS. 2A~2D are cross-sectional views showing a method for manufacturing a control element of an organic electro-luminescent display according to one preferred embodiment of the invention.

In FIG. 2A, a first gate electrode 222, a bottom electrode 224 of a capacitor and a second gate electrode 226 are formed on an insulating substrate 210. The material of the first gate electrode 222, the bottom electrode 224 of the capacitor and the second gate electrode 226 may be molybdenum, chromium, iridium, aluminum, titanium, combination thereof or alloy thereof. The forming method may be physical vapor deposition first, which deposits a conductor layer, such as sputtering and then patterning the conductor layer by, for example, photolithography.

Figure 2B:
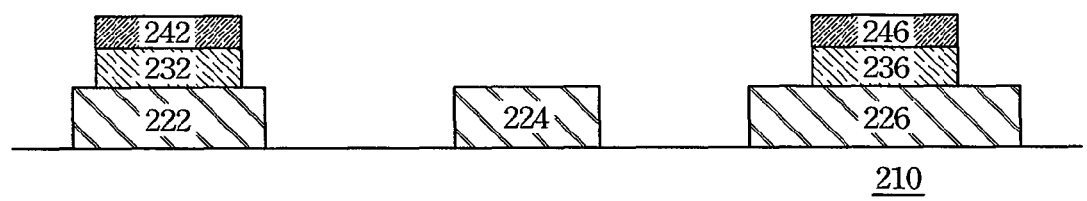

In FIG. 2B, a first gate dielectric 232 and a first channel 242 are formed lo over at least part of the first gate electrode 222, and a second gate dielectric 236 and a second channel 246 are formed over at least part of the second gate electrode 226. The material of the first gate dielectric 232 and the second gate dielectric 236 may be silicon oxide, silicon nitride or combination thereof. The material of the first channel 242 and the second channel 246 may be amorphous silicon. The forming method may be depositing a dielectric layer and a semiconductor layer first and then patterning the dielectric layer and the semiconductor layer, such as by photolithography.

Figure 2C:
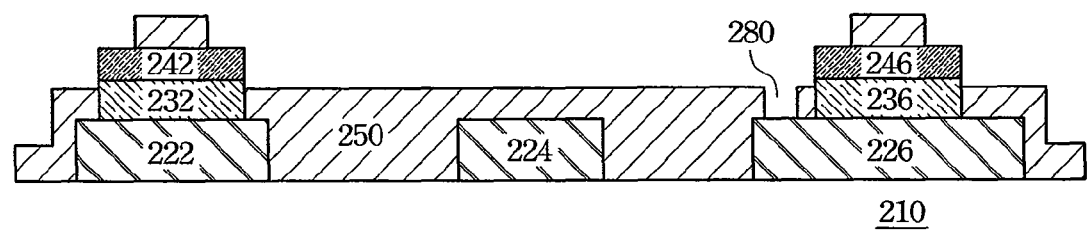

In FIG. 2C, an etching stop layer 250 is formed over the insulating substrate 210. After forming the etching stop layer 250, the etching stop layer 250 is patterned to expose parts of the upper surface of the first channel 242 and the second channel 246 for forming source/drain contacts on each of the first channel 242 and the second channel 246 and form a hole 280 on part of the second gate electrode 226. The material of the etching stop layer 250 may be silicon oxide, silicon nitride or silicon oxynitride.

Figure 2D:
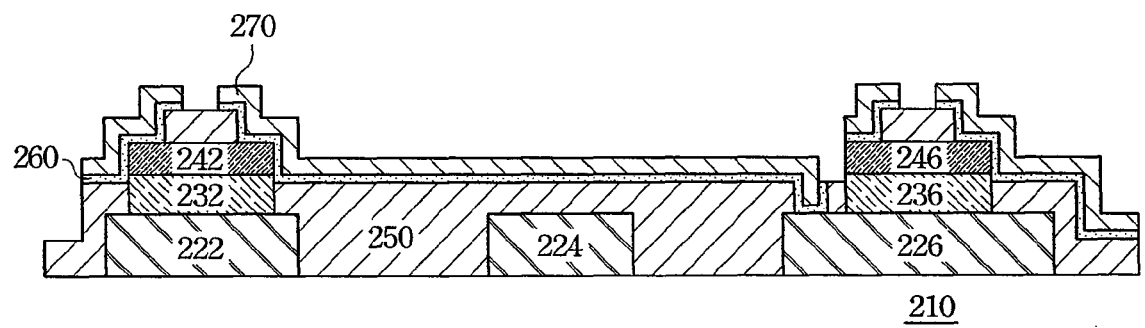

In FIG. 2D, a doped semiconductor layer 260 and a conductor layer 270 are formed over the insulating substrate 210 in order. Then, the conductor layer 270 and the doped semiconductor layer 260 are patterned for forming a first source/drain electrode and a second source/drain electrode on the first channel 242, a third source/drain electrode and a fourth source/drain electrode on the second channel 246, a conducting wire to electrically connect the second source/drain electrode and the second gate electrode 226 via the hole 280, and an upper electrode of the capacitor. The material of the doped semiconductor layer 260 may be N-doped semiconductor.

The material of the conductor layer 270 may be molybdenum, chromium, iridium, aluminum, titanium, combination thereof or alloy thereof.

Embodiment II

Reference is made to FIGS. 3A~3D, which are cross-sectional views showing a method for manufacturing a control element of an organic electro-luminescent display according to another preferred embodiment of the invention.

Figure 3A:
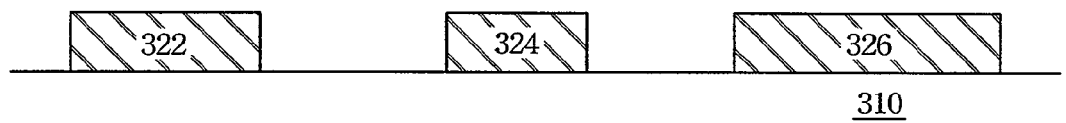
FIGS. 3A~3D are cross-sectional views showing a method for manufacturing a control element of an organic electro-luminescent display according to another preferred embodiment of the invention.

In FIG. 3A, a first gate electrode 322, a bottom electrode 324 of a capacitor and a second gate electrode 326 are formed on an insulating substrate 310. The material of the first gate electrode 322, the bottom electrode 324 of the capacitor and the second gate electrode 326 may be molybdenum, chromium, iridium, aluminum, titanium, combination thereof or alloy thereof. The forming method may be physical vapor deposition first, which deposits a conductor layer, such as sputtering and then patterning the conductor layer by, for example, photolithography.

Figure 3B:
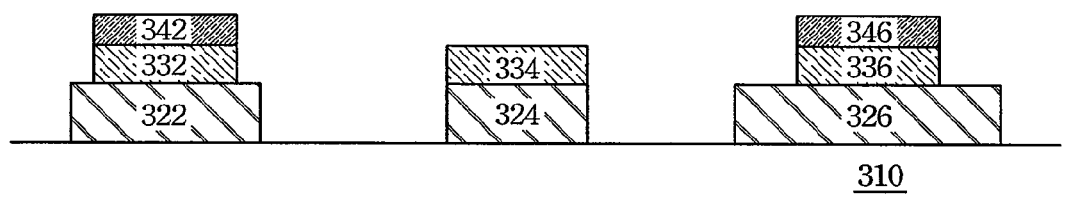
Figure 3C:
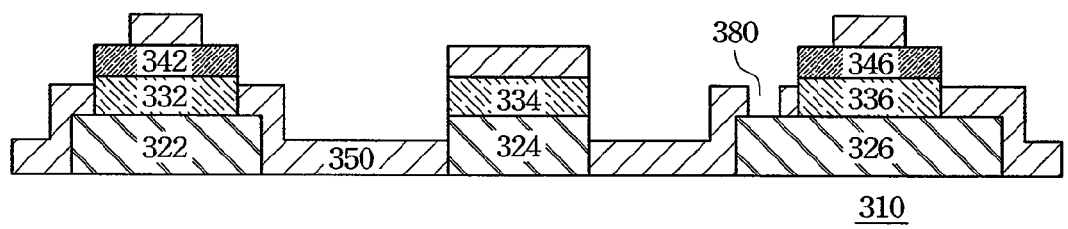
Figure 3D:
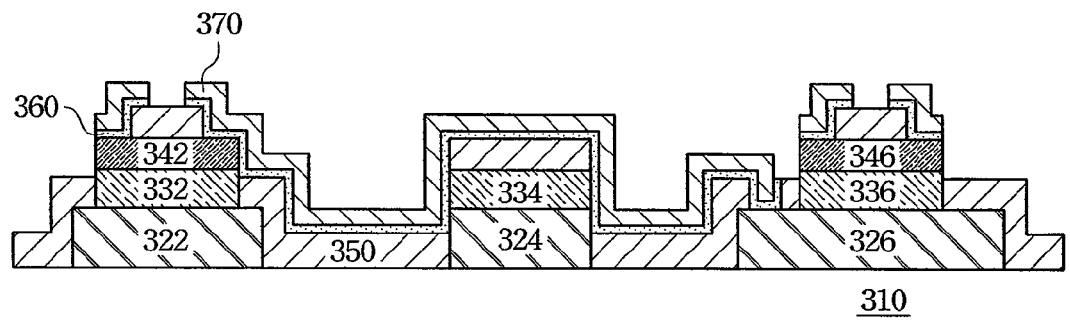

In FIG. 3B, a first gate dielectric 332 and a first channel 342 are formed over at least part of the first gate electrode 322; a stack dielectric 334 of the capacitor is formed on the bottom electrode 324 of the capacitor; and a second gate dielectric 336 and a second channel 346 are formed over at least part of the second gate electrode 326. The material of the first gate dielectric 332, the stack dielectric 334 and the second gate dielectric 336 may be silicon oxide, silicon nitride or combination thereof. The material of the first channel 342 and the second channel 346 may be amorphous silicon. The forming method may be done by following steps. A dielectric layer is deposited first. Then, the dielectric lo layer is patterned to form the first gate dielectric 332, the stack dielectric 334 and the second gate dielectric 336, such as by photolithography. After the dielectric layer is patterned, a semiconductor layer is deposited. Then, the semiconductor layer is patterned to form the first channel 342 and the second channel 346, such as by photolithography. Follow-up steps are the same as the steps illustrated in the Embodiment I.

Embodiment III

Reference is made to FIGS. 4A~4D, which are cross-sectional views showing a method for manufacturing a control element of an organic electro-luminescent display according to still another preferred embodiment of the invention.

Figure 4A:
FIGS. 4A~4D are cross-sectional views showing a method for manufacturing a control element of an organic electro-luminescent display according to still another preferred embodiment of the invention.

In FIG. 4A, a first gate electrode 422, a bottom electrode 424 of a capacitor and a second gate electrode 426 are formed on an insulating substrate 410. The material of the first gate electrode 422, the bottom electrode 424 of the capacitor and the second gate electrode 426 may be molybdenum, chromium, iridium, aluminum, titanium, combination thereof or alloy thereof. The forming method may be physical vapor deposition first, which deposits a conductor layer, such as sputtering and then patterning the conductor layer by, for example, photolithography.

Figure 4B:
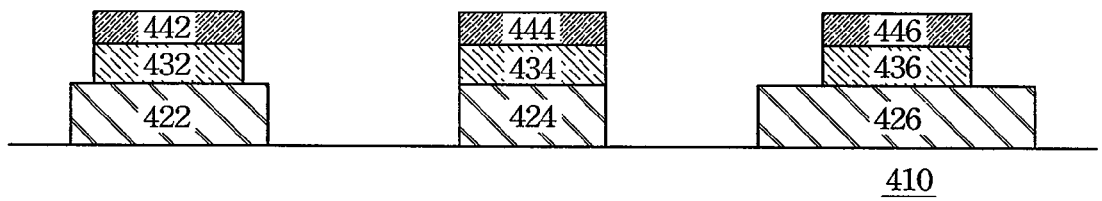
Figure 4C:
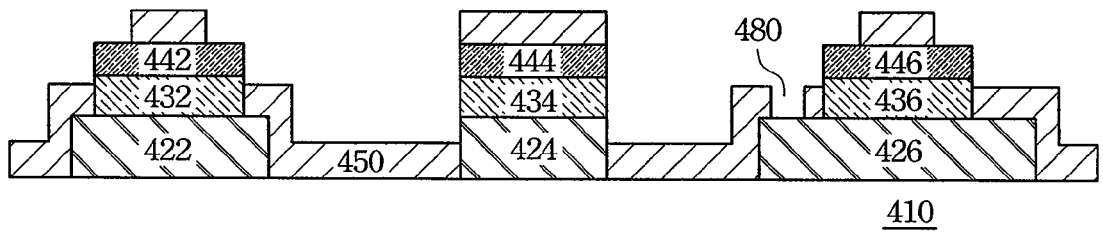
Figure 4D:
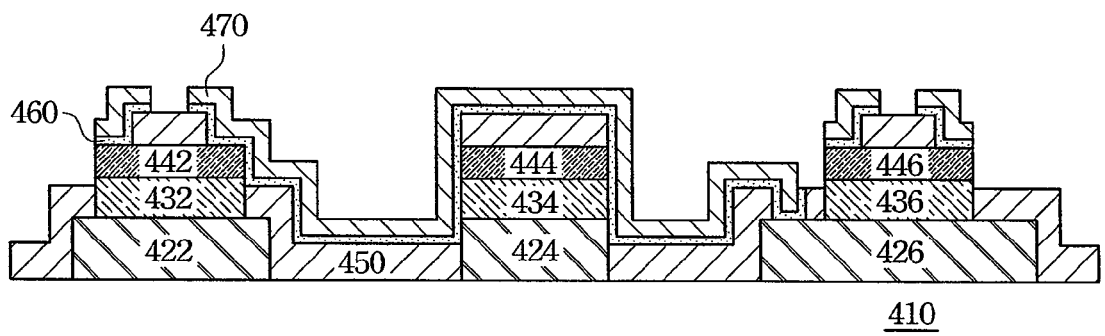

In FIG. 4B, a first gate dielectric 432 and a first channel 442 are formed over at least part of the first gate electrode 422; a stack dielectric 434 and a stack semiconductor layer 444 of the capacitor are formed on the bottom electrode 424 of the capacitor; and a second gate dielectric 436 and a second channel 446 are formed over at least part of the second gate electrode 426. The material of the first gate dielectric 432, the stack dielectric 434 and the second gate dielectric 436 may be silicon oxide, silicon nitride or combination thereof. The material of the first channel 442, the stack semiconductor layer 444 and the second channel 446 may be amorphous silicon. The forming method may be depositing a dielectric layer and a semiconductor layer first and then patterning the dielectric layer and the semiconductor layer, such as by photolithography. Follow-up steps are the same as the steps illustrated in the embodiment 1.

In conclusion, the embodiments of the invention have the advantages of:

(1) reducing the use of photolithography because the etching stop layer and the hole are formed in the same step;

(2) possibly not needing to change the electrical characteristics when the capacitance of the capacitor is changed; and (3) possibly not needing to change the geometric characteristics when the capacitance of the capacitor is changed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a control element of an organic electro-luminescent display, comprising:
    providing an insulating substrate;
    forming a first gate electrode, a bottom electrode of a capacitor and a second gate electrode on the insulating substrate;
    forming a first gate dielectric and a first channel over at least part of the first gate electrode;
    forming a second gate dielectric and a second channel over at least part of the second gate electrode;
    forming an etching stop layer, over the insulating substrate;
    patterning the etching stop layer to expose parts of the upper surface of the first channel and the second channel for forming source/drain contacts on each of the first channel and the second channel and expose part of the upper surface of the second gate electrode;
    forming a doped semiconductor layer and a conductor layer, over the insulating substrate in order; and
    patterning the conductor layer and the doped semiconductor layer for forming a first source/drain electrode and a second source/drain electrode on the first channel, a third source/drain electrode and a fourth source/drain electrode on the second channel, a conducting wire to electrically connect the second source/drain electrode and the second gate electrode, and an upper electrode of the capacitor; and
    wherein the etching stop layer contacts the bottom electrode of the capacitor.

2. The method of claim 1, further comprising: forming a capacitor stack over the bottom electrode of the capacitor before forming the etching stop layer.

3. The method of claim 2, wherein the capacitor stack comprises a stack dielectric positioned over the bottom electrode of the capacitor.

4. The method of claim 3, wherein the capacitor stack further comprises a stack semiconductor layer positioned over the stack dielectric.

* * * * *